United States Patent
Bossart

[11] Patent Number: 5,952,045
[45] Date of Patent: Sep. 14, 1999

[54] METHOD AND APPARATUS FOR IMPROVED COATING OF A SEMICONDUCTOR WAFER

[75] Inventor: Tim Bossart, Boise, Id.

[73] Assignee: Micron Technology, Inc., Boise, Id.

[21] Appl. No.: 08/953,445

[22] Filed: Oct. 17, 1997

Related U.S. Application Data

[63] Continuation of application No. 08/508,052, Jul. 27, 1995, abandoned.

[51] Int. Cl.$^6$ .............. B05D 3/12; B05C 11/02; H01L 21/469
[52] U.S. Cl. .............. 427/240; 118/52; 118/500; 427/385.5; 427/377; 437/231
[58] Field of Search .............. 427/240, 385.5, 427/377; 118/52, 500; 437/231

[56] References Cited

U.S. PATENT DOCUMENTS 4,838,979  6/1989  Nishida ................. 427/240
5,658,615  8/1997  Hasebe et al. .......... 427/240

*Primary Examiner*—Janyce Bell

[57] ABSTRACT

Disclosed is a spin coating apparatus and method for coating a semiconductor wafer of known diameter with a thin and substantially uniform coating of a solution. The apparatus comprises a containment bowl with a rotatable vacuum chuck, having a diameter less than hat of the wafer, rotatably mounted inside the bowl. The vacuum chuck captively holds a bottom surface of the wafer. Directly beneath the bottom surface of the wafer is a substantially frustroconical deflector ring. The deflector ring is concentrically attached about and stationary with respect to the rotatable vacuum chuck. The top surface of the ring is located just below and in close-spaced parallel relation to the bottom surface of the wafer. The top face of the deflector has a minimum diameter that is greater that the diameter of the semiconductor wafer. With the system of this invention the requirement of an organic solvent wash of the wafer backside after the coating of the wafer top surface is eliminated.

33 Claims, 1 Drawing Sheet

METHOD AND APPARATUS FOR IMPROVED COATING OF A SEMICONDUCTOR WAFER

RELATED APPLICATION

This application is a continuation of U.S. application Ser. No. 08/508,0502, filed Jul. 27, 1995, now abandoned.

BACKGROUND OF THE INVENTION

1. Technical Field

The invention relates to an apparatus and method for spin coating solutions onto the surface of a semiconductor wafer.

2. Background

The current practice in semiconductor manufacturing is to use thin film fabrication techniques. A large variety of materials can be deposited using thin films, including metals, semiconductors, insulators and the like. The composition and uniformity of these thin layers must be strictly controlled to facilitate etching of submicron features. Many of these materials are best suited to application of the substrate with a liquid which is then dried to form the solid thin film. The liquid materials are most often deposited using either spin or spray coating methods.

In a conventional spin coating process the semiconductor wafer to be processed is placed on a rotatable chuck and held in place by vacuum. The chuck is referred to by a variety of names, including spin chuck and vacuum chuck. The spin chuck has a diameter slightly less than that of the semiconductor wafer. The wafer is positioned on the chuck such that it is resting in a level horizontal plane with the inactive surface, designated as the bottom, in contact with the chuck and the opposite top surface is coated with the desired solution. In standard systems the chuck is powered and rotated by a motor.

In the spin coating process, the solution can be dispensed prior to spinning the wafer, which is referred to as static dispense or after the semiconductor wafer has been set in motion, which is termed dynamic dispense. In either case after the solution has been dispensed onto the top surface, the wafer is spun at a constant speed to establish a desired relatively uniform thickness of the solution across the wafer. Once the liquid layer acquires the relatively uniform and symmetrical profile, the remainder of the spin cycle allows the solvent in the solution to evaporate to produce a solid film on the wafer top surface.

The supply of the solution is dispensed onto the wafer from a supply nozzle. The nozzle can either be configured to simply drop a specific quantity onto the semiconductor wafer surface in the form of a puddle or to spray the desired quantity onto the wafer surface in the form of a mist.

After the solution is dispensed onto the wafer it is distributed uniformly over the surface largely as a result of the radial distribution of the liquid due to centrifugal and drag forces created by the spinning of the wafer.

The solution deposited on the wafer goes through a number of stages during the spin process, primarily due to the fluid dynamics created by the spinning substrate. At the start of the spinning a wave of solution is created that moves towards the edge of the wafer. As the major portion of the solution in the wave reaches the edge of the wafer it forms a ridge, this is referred to as the corona stage. A bead subsequently forms along the edge of the wafer as the solvent evaporates from the ridge formed in the corona stage. As the corona disappears the remaining solution leaves the surface in the form of a fine spiral-like mist. This spiral stage results in thousands of droplets spinning off the wafer and splashing back onto the wafer off of the surrounding spinner bowl. Bowls and splashguards have been designed to prevent this splashing. Additionally, solvent washing of the bottom of the wafer can eliminate the edge bead that forms during the spin coating.

Every layer deposited on the top surface of the wafer that possesses irregularities and variations in its uniformity has an adverse affect during all subsequent processing steps that the wafer undergoes. Uniformity of the layers is a critical factor in semiconductor wafer production. The film thickness uniformity obtained using the spin coating process is largely a function of size and shape of the wafer, because of the influence centrifugal force has in the spin coat process. The fluid dynamics described above become more pronounced as the diameter of the wafer used increases and the trend is towards using larger wafers.

To compensate for these undesirable influences the standard practice is to use a large starting volume of solution in the spin coating process. A large starting volume of solution also translates into a large amount of wasted solution. The increased amount of solution used also means an increase in the cost of production for semiconductor wafers. Approximately 30%–90% of the process solution used in the spin coating process is wasted in the form of excess solution that is thrown off of the wafer substrate. The excess solution is deposited to assure a thin uniform layer in the end product.

There have been a number of inventions proposed to alleviate these problems. U.S. Pat. No. 5,395,649 to Ikeda, employs a plate positioned above the wafer to change the air turbulence and fluid behavior on the wafer for improved layer uniformity.

In U.S. Pat. No. 5,405,813 to Rodrigues, a plurality of rotational speeds are used to increase layer uniformity and decrease the amount of starting solution required.

A number of patents use different types of nozzle mechanisms. U.S. Pat. No. 5,405,443 to Akimoto et al., discloses a nozzle that dispenses a fixed quantity of solution without entrainment of bubbles and particles utilizing a negative pressure system. U.S. Pat. No. 4,267,212 to Shinichi, includes moving the conventional spin coat nozzle across the radius of the wafer during solution application while rotating the wafer at a first and second speed. U.S. Pat. No. 5,403,617 to Haaland, enlists a computer controlled droplet generator to select droplet size and velocity to cause impact with the wafer without splashing. There is still a demand in the semiconductor wafer manufacturing industry for more economical means of solution application to the wafer that improves the uniformity of the process layers on the wafers and uses less chemicals.

The other major process used to deposit coatings on to wafer substrates is a spray coat process. The spray coating process permits much more efficient use of the process solution because the large starting excess needed for the spin coating process is not needed for the spray coating process. The problem with conventional spray coat processes are that they require thorough and comprehensive optimization of the process to obtain the quality of uniform layer thickness that is more easily obtained with the spin coat process. With the spray coat process the size and shape of the wafer have little effect on the end result. The uniformity of thickness of dielectric coating obtained using the spray process is determined by the sweeping motion of the spray nozzle.

An alternative to using either the spin coat or spray coat processes and their inherent problems is to coat the wafers using chemical vapor deposition (CVD). The CVD process includes the following basic steps: a) a known composition of reactant and inert gases is introduced into a reaction chamber; b) the gas species move to the substrate; c) the reactants are decomposed and chemically reacted at a heated surface of the substrate; e) the gaseous by-products are desorbed and removed from the reaction chamber. With the CVD process high purity films can be formed and deposited and a greater variety of starting compounds can be used. There are certain compositions that cannot be adequately applied to the wafer by any other process. The CVD process also had certain disadvantages. It increases both the cost of wafer production and increases the complexity of manufacturing the wafer. There are also often defects in the uniformity of the layers deposited on the wafer using the CVD process. Because of the increased cost and complexity of the CVD process it is still used far less that either spin or spray coating of the dielectrics onto semiconductor wafers.

SUMMARY OF THE INVENTION

It is a main object of this invention to provide an improved spin coating method and apparatus which coats a selected coating solution film on a substrate with superior film thickness uniformity.

It is also an object of this invention to provide an improved spin coating method and apparatus which coats a selected coating solution film on a substrate with superior film thickness uniformity without the use of an organic solvent wash of the wafer backside.

It is another object to provide a spin coating method and apparatus for coating the top surface of a semiconductor wafer with a desired film wherein the backside of the wafer does not have any selected coating solution film deposition at the end of the process.

These objects, as well as others, are satisfied by a spin coating apparatus for coating a semiconductor wafer of known diameter with a thin and substantially uniform coating of a solution. The apparatus comprises a containment bowl with a rotatable vacuum chuck, having a diameter less than that of the wafer, rotatably mounted inside the bowl. The vacuum chuck captively holds a bottom surface of the wafer. Directly beneath the bottom surface of the wafer is a substantially frustroconical or frustum shaped deflector ring. The deflector ring is concentrically attached about and stationary with respect to the rotatable vacuum chuck. The top surface of the ring is located just below and in close-spaced parallel relation to the bottom surface of the wafer. The top face of the deflector has a minimum diameter that is greater that the diameter of the semiconductor wafer.

The invention eliminates the need for a post-coating solvent washing of the backside of the wafer. The utility of this novel manufacturing apparatus and process includes improved environmental health and safety when applying selected solution coatings to the surface of semiconductor wafers. By being able to use less solvent, there is a decreased risk from the flammability associated with solvent contained in the solution. Additionally, there is increasing concern and regulatory requirements with regard to the indoor air quality of working areas where organic solvents are used, both as to the comfort of the users and their health. With decreased use of process solution as a result of this novel apparatus and process, there can be increased indoor air quality.

An advantage of the invention is that the amount of coating solution liquid that is wasted as excess is reduced. Another advantage of the present invention is that less organic solvent is used because of the elimination of the wafer backside wash. Decreased use of organic solvent improves workplace safety and overall quality of the environment, both of which are receiving increased scrutiny and stricter regulation. The decrease in organic solvents also decreases the risk of flammability and the problems associated with proper disposal of organic solvents.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
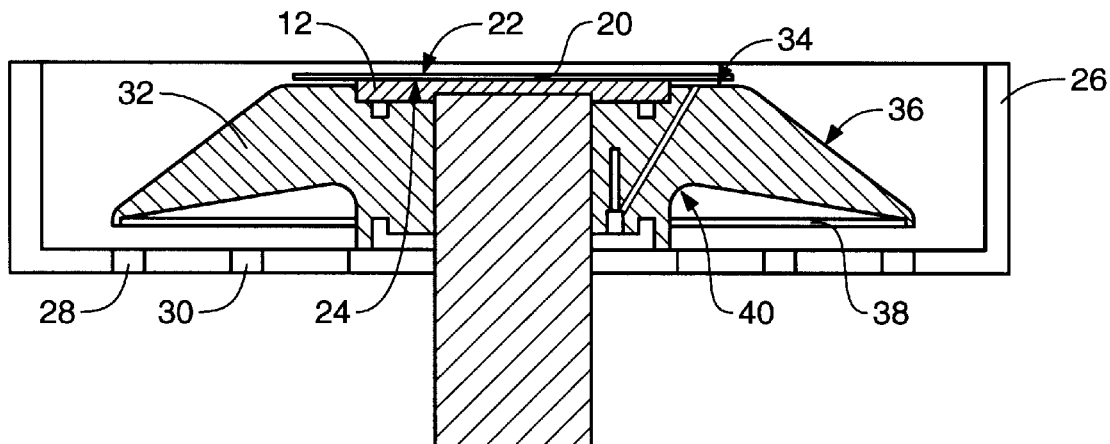
FIG. 1 is a side cross section view of a spin coating apparatus having an air ring installed therein according to the invention.
Figure 2:
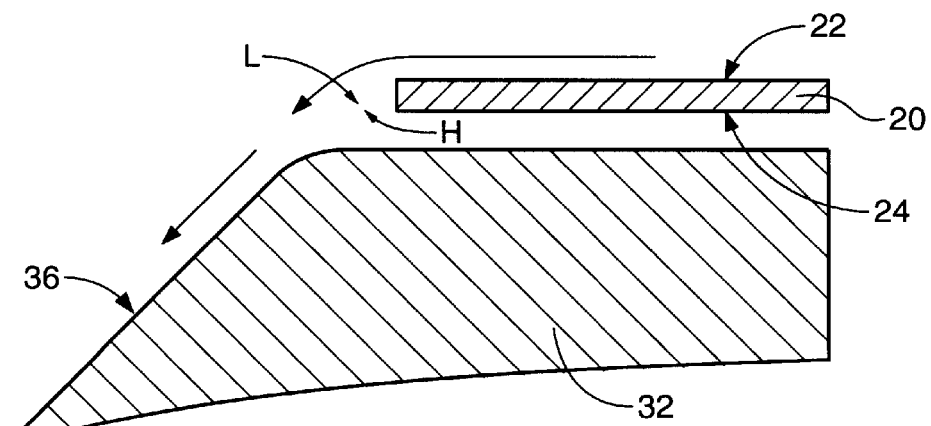
FIG. 2 is a detail cross section view of one side of the wafer and air ring according to the invention.

Referring now to FIGS. 1 and 2, a preferred embodiment of the invention will be described in detail. A spin chuck 12 holds wafer 20 by vacuum allowing the rotation of wafer 20 in the known manner. Spin chuck 12 holding wafer 20 is enclosed by containment bowl 26 inside a housing. Bowl 26 can be moved up or down to surround wafer 20. Exhaust means, here vent 28 and drain means, here vent 30 are connected through bottom 27 of bowl 26.

Spin chuck 12 has a diameter that is less than the diameter of wafer 20, so that wafer top surface 22 and wafer bottom surface 24 extend beyond the edge of spin chuck 12. Directly beneath wafer 20 is deflector ring 32. Deflector ring 32 is substantially frustroconical or frustum in shape. Top surface 34 of ring 32 has a minimum diameter greater than the diameter of wafer 20, such that ring top surface 34 extends past the edge of wafer 20. Deflector ring top surface 34 is located just below and in close spaced parallel relation to wafer bottom surface 24. In the preferred embodiment ring top surface 34 is 2.5 mm from wafer bottom 24.

Ring top surface 34 has a smooth sloping and aerodynamic transition into conical wall 36. Ring 32 is attached in a stationary manner concentrically around spin chuck 12. Deflector ring bottom surface 38 is parallel to ring top surface 34. In the preferred embodiment ring bottom 38 includes annular recess 40.

In use, bowl 26 is raised to surround spin chuck 12 and wafer 20. Spin chuck 12 is rotated and captively holds wafer 20 in the known manner. The selected solution is applied to wafer top surface 22 either prior to or after the initiation of rotation. Exhaust vent 28 and drain vent 30 are also activated in the known manner. With the system of this invention the requirement of an organic solvent wash of wafer bottom surface or backside 24 after the coating of wafer top surface 22 is eliminated.

While not intended to be a limitation to this invention, a possible explanation for this unexpected result is that the design of ring 32 changes the airflow around wafer 20 during the coating process. It is likely that a pressure differential is created at the edge of wafer 20. Accordingly, a relative high pressure zone H exists between wafer bottom surface 24 and ring top surface 34 and a relatively lower pressure L is resident across wafer top surface 22 and around deflector wall 36 most likely created by the faster moving air around deflector ring 32.

This process works well for polymer dielectrics, but can also be used equally well for coating any solution onto the surface of semiconductor wafers including polysiloxanes, photo resists, developers, adhesives, protective coatings and the like.

It will therefore be understood that modifications and variations are possible without departing from the scope of the invention as expressed in the following claims.

I claim:

1. A spin-coat deflection system, comprising:
   a chuck configured to support a wafer;
   a deflector top under said chuck and having a top diameter greater than said wafer; and
   a deflector bottom coupled to said deflector top and having a bottom diameter greater than said top diameter.

2. The spin-coat deflection system in claim 1, further comprising:
   a deflector wall wider than said deflector top, narrower than said deflector bottom, and interposed between said deflector top and said deflector bottom;
   and wherein said deflector bottom is coupled to said deflector top through said deflector wall.

3. The spin-coat deflection system in claim 2, wherein said deflector top further comprises a ring top; and said deflector bottom further comprises a ring bottom.

4. A skin coat processor deflector ring, comprising
   a frustum-shaped wall configured to encompass a chuck configured to hold a wafer; and
   a top ring inwardly concentrically extending from said wall and having a radius extending beyond said wafer.

5. The spin coating processor deflector ring in claim 4, wherein said frustum-shaped wall has a narrow end and a wide end; and wherein said top ring extends from said narrow end.

6. A processing apparatus, comprising:
   a chuck configured to support a surface for spin coating; and
   a deflector ring under said chuck and having a top perimeter defining an area greater than said surface.

7. A gas flow deflector for a skin coat processor, comprising
   a planar top gas flow-deflecting portion wider than a wafer to be supported thereover; and
   a side gas flow-deflecting portion aerodynamically transitioning from said top portion.

8. The gas flow deflector in claim 7, further comprising a bottom portion transitioning from said side portion and defining an annular recess under said side portion.

9. A coating processor, comprising:
   a chuck configured to receive and rotate a wafer; and
   a deflection ring under said chuck, comprising:
      a ring top generally parallel to said wafer and extending beyond said
      wafer, wherein said ring top and said wafer define a first pressure zone.

10. The coating processor in claim 9, wherein said wafer and said ring top define a first pressure zone extending beyond said wafer.

11. The coating processor in claim 10, wherein said wafer at least partially defines a second pressure zone extending above said wafer, wherein said second pressure zone has a lower ambient pressure than said first pressure zone.

12. The coating processor in claim 11, wherein said deflection ring further comprises a ring wall descending and expanding from said ring top; and wherein said ring wall further defines said second pressure zone.

13. A spin coating device, comprising:
    a bowl configured to receive excess coating material from a wafer;
    a support surface within said bowl and configured to accommodate said wafer;
    a ring top within said bowl and configured to be at most partially covered by said wafer; and
    a wall extending from said ring top.

14. The spin coating device in claim 13, wherein said ring top is generally planar and faces said wafer; and said wall is frustoconical.

15. The spin coating device in claim 14, wherein said wall faces askew from said wafer.

16. A spin-coat apparatus, comprising:
    a frustoconical wall configured to guide coating material descending from a wafer having a wafer diameter, wherein said wall has a minimum diameter greater than said wafer diameter;
    a ring top transitioning from said wall at points defining said minimum diameter, wherein said ring top is parallel to said wafer; and
    a wafer support surface above said ring top.

17. A method of protecting a bottom surface of a wafer from a spun-on material, comprising:
    depositing said material onto a top surface of said wafer;
    guiding excess amounts of said material off a perimeter of said top surface with a flowing gas; and
    placing a deflector surface under said perimeter, wherein said deflector surface is parallel to said wafer;
    generating a high-pressure zone under said perimeter, wherein said high-pressure zone has an atmospheric pressure greater than an atmospheric pressure over said perimeter.

18. The method of claim 17, wherein said step of generating a high-pressure zone further comprises spinning said wafer.

19. A method of preventing a coating material from reaching a bottom of a spinning wafer, comprising:
    generating a gas flow toward said wafer;
    moving said coating material with said gas flow;
    providing a deflector ring under said wafer having a top of greater diameter than said wafer;
    generating a first ambient pressure above said wafer; and
    generating a second ambient pressure under said bottom of said wafer, wherein said second ambient pressure is greater than said first ambient pressure.

20. The method in claim 19, wherein said step of generating a second ambient pressure further comprises generating said second ambient pressure under an outer portion of said bottom of said wafer.

21. The method in claim 20, wherein said step of generating a second ambient pressure further comprises extending said second ambient pressure beyond said bottom of said wafer.

22. The method in claim 21, wherein said step of generating a second ambient pressure further comprises extending said second ambient pressure up an edge of said wafer.

23. A method of generating a pressure differential between a first area over a wafer perimeter and a second area under said wafer perimeter, comprising:

providing a deflector under said wafer perimeter, wherein said deflector includes a wafer-parallel surface under said wafer perimeter; and spinning said wafer perimeter.

24. A method of providing fluid guidance around a wafer in a skin coat device, comprising:

decreasing a first pressure above said wafer; and generally maintaining a second pressure below said wafer.

25. The method in claim 24, wherein said step of generally maintaining a second pressure further comprises generally maintaining said second pressure below at least an outermost portion of said wafer.

26. A method of positioning a deflector under a wafer within a skin coat apparatus, comprising:

concealing a first portion of said deflector under said wafer; and exposing a second portion of said deflector, wherein said second portion is parallel to said wafer.

27. The method of claim 26, wherein said step of concealing a first portion of said deflector further comprises concealing an inner portion of said deflector; and said step of exposing a second portion of said deflector further comprises exposing an outer portion of said deflector.

28. A method of pressurizing a spin-coating system, comprising:

supporting a wafer within said system with a chuck;

defining a space under said wafer with a deflector;

maintaining said space under a perimeter of said wafer;

introducing a gas to said system above said wafer;

exhausting said gas through a vent within said system; and spinning said chuck.

29. The method in claim 28, wherein said step of defining a space under said wafer further comprises defining said space with a top surface of said deflector that is generally parallel with said wafer.

30. The method in claim 29, wherein said step of maintaining said space further comprises having said top surface of said deflector extend at least up to said perimeter of said wafer.

31. The method in claim 30, wherein said step of maintaining said space further comprises having said top surface of said deflector extend beyond said perimeter.

32. The method in claim 31, further comprising a step of surrounding said chuck, said wafer, and said deflector with a cup.

33. The method in claim 32, wherein said step of exhausting said gas further comprises exhausting said gas through a vent under said deflector.

* * * * *

UNITED STATES PATENT AND TRADEMARK OFFICE
CERTIFICATE OF CORRECTION

PATENT NO : 5,952,045

DATED : September 14, 1999

INVENTOR(S) : Tim Bossart

It is certified that error appears in the above-identified patent and that said Letters Patent is hereby corrected as shown below:

At column 1, line 7, replace "0502" with --052--.
At column 3, line 43, replace "frustroconical" with --frustoconical--.
At column 5, line 30 (preamble of claim 4), replace "skin coat" with --spin coating--; at column 5, line 45 (preamble of claim 7), replace "skin" with --spin--.
At column 7, line 6 (preamble of claim 24), replace "skin" with --spin--; at column 7, line 16 (preamble of claim 26), replace "skin" with --spin--.

Signed and Sealed this

Twenty-fifth Day of January, 2000

Attest:

Attesting Officer

*Acting Commissioner of Patents and Trademarks*